United States Patent
Cho et al.

(10) Patent No.: US 9,661,774 B2
(45) Date of Patent: May 23, 2017

(54) PORTABLE DISPLAY DEVICE

(71) Applicant: Samsung Display Co., Ltd., Yongin, Gyeonggi-Do (KR)

(72) Inventors: Yong-Youl Cho, Yongin (KR); Kwan-Young Han, Yongin (KR); Jong-Hwan Kim, Yongin (KR); Kyu-Ho Jung, Yongin (KR); Young-In Lim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 583 days.

(21) Appl. No.: 13/775,632

(22) Filed: Feb. 25, 2013

(65) Prior Publication Data

US 2013/0314881 A1 Nov. 28, 2013

(30) Foreign Application Priority Data

May 23, 2012 (KR) ........................ 10-2012-0054723

(51) Int. Cl.
*H05K 1/00* (2006.01)
*H05K 7/02* (2006.01)
(Continued)

(52) U.S. Cl.
CPC ............ *H05K 7/02* (2013.01); *G02F 1/1333* (2013.01); *G02F 1/13452* (2013.01);
(Continued)

(58) Field of Classification Search
CPC ............................ G02F 1/1339; G02F 1/13439
(Continued)

(56) References Cited

U.S. PATENT DOCUMENTS 8,514,362 B2   8/2013   Kim
8,908,257 B2   12/2014  Song et al.
(Continued)

FOREIGN PATENT DOCUMENTS

CN   1825616 A   8/2006
CN   1892371 A   1/2007
(Continued)

OTHER PUBLICATIONS

Cited in attached Chinese Office Action issued on Sep. 5, 2016 by SIPO in connection with Chinese Patent Application No. 201310087089.5 and Request for Entry attached herewith.

*Primary Examiner* — Tuan T Dinh
(74) *Attorney, Agent, or Firm* — Robert E. Bushnell, Esq.

(57) ABSTRACT

A portable display device may include a display panel, a window, an attaching member and a blocking member. The display panel may have a drive circuit region and a display region. The window may be positioned facing to the display panel. The attaching member may be interposed between the display region of the display panel and the window to attach the display panel to the window. The blocking member may be arranged on a boundary line between the drive circuit region and the display region to prevent the attaching member from infiltrating into the drive circuit region. Thus, flows of the attaching member may be readily controlled using the blocking member having a simple structure to prevent the infiltration of the attaching member into the drive circuit region. As a result, the portable display device may be assembled by a simple process and a low cost.

11 Claims, 10 Drawing Sheets

(51) Int. Cl.
    *G02F 1/1333* (2006.01)
    *G02F 1/1345* (2006.01)
    *H05K 13/04* (2006.01)
    *H01L 51/52* (2006.01)

(52) U.S. Cl.
    CPC ........ *H01L 51/524* (2013.01); *H01L 51/5246* (2013.01); *H05K 13/0469* (2013.01); *G02F 2001/133331* (2013.01); *G02F 2201/501* (2013.01); *G02F 2202/023* (2013.01); *G02F 2202/28* (2013.01); *Y10T 156/10* (2015.01)

(58) Field of Classification Search
    USPC ...... 361/749–750; 174/254–256; 349/58–62, 349/149–150
    See application file for complete search history.

(56) References Cited

U.S. PATENT DOCUMENTS

| | | | | |
|---|---|---|---|---|
| 2002/0080319 | A1* | 6/2002 | Hagiwara | ............. G02F 1/1339 349/153 |
| 2004/0114073 | A1* | 6/2004 | Sakai | ................. G02F 1/13439 349/113 |
| 2005/0155704 | A1 | 7/2005 | Yokajty et al. | |
| 2006/0111009 | A1 | 5/2006 | Wang et al. | |
| 2007/0093002 | A1* | 4/2007 | Maekawa | ............. H01L 21/288 438/149 |
| 2008/0018229 | A1* | 1/2008 | Yamazaki | ........... H01L 27/3246 313/498 |
| 2009/0086123 | A1 | 4/2009 | Tsuji et al. | |
| 2009/0148678 | A1 | 6/2009 | Hwang | |
| 2009/0206734 | A1 | 8/2009 | Kim et al. | |
| 2010/0245707 | A1 | 9/2010 | Harada | |
| 2011/0025949 | A1 | 2/2011 | Park | |
| 2011/0115364 | A1 | 5/2011 | Kim | |
| 2012/0154710 | A1 | 6/2012 | Hwang et al. | |
| 2013/0314881 | A1 | 11/2013 | Cho et al. | |
| 2016/0005801 | A1 | 1/2016 | Yamazaki | |

FOREIGN PATENT DOCUMENTS

| | | |
|---|---|---|
| CN | 102194379 A | 9/2011 |
| CN | 102486591 A | 6/2012 |
| CN | 203150021 U | 8/2013 |
| KR | 10-2010-0004292 | 1/2010 |
| KR | 10-2011-0124534 | 11/2011 |

* cited by examiner

PORTABLE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 23 May 2012 and there duly assigned Serial No. 10-2012-0054723.

BACKGROUND OF THE INVENTION

Field of the Invention

The present invention generally relates to a portable display device and a method of assembling the same.

Description of the Related Art

Generally, a portable display device such as a cellular phone may include a display panel and a window. The window may be attached to the display panel using an attaching member such as a resin. Because the non-hardened resin may have the potential of flowing, a process for controlling flows of the resin coated on the display panel may be required. That is, controlling resin flows may prevent the resin from being spilled from the display panel.

The above information disclosed in this Related Art section is only for enhancement of understanding of the background of the invention and therefore it may contain information that does not form the prior art that is already known to a person of ordinary skill in the art.

SUMMARY OF THE INVENTION

Example embodiments relate to a portable display device such as a cellular phone, and a method of assembling the portable display device.

Example embodiments provide a portable display device that may be capable of controlling flows of a resin with a simple structure by a cheap cost.

Example embodiments provide a method of assembling the above-mentioned portable display device.

According to one aspect of example embodiments, there is provided a portable display device. The portable display device may include a display panel, a window, an attaching member and a blocking member. The display panel may have a drive circuit region and a display region. The window may be positioned facing to the display panel. The attaching member may be interposed between the display region of the display panel and the window to attach the display panel to the window. The blocking member may be arranged on a boundary line between the drive circuit region and the display region to prevent the attaching member from infiltrating into the drive circuit region.

In example embodiments, the drive circuit region may be located adjacent to only one side surface of the display panel. The blocking member may be wholly arranged on the boundary line. The blocking member may be parallel to the side surface of the display panel to which the drive circuit region may be located adjacent.

In example embodiments, the portable display device may further include a flexible printed circuit (FPC) arranged in the drive circuit region. The blocking member may be partially arranged on the boundary line to prevent the attaching member from infiltrating into the FPC.

In example embodiments, the blocking member may include a main blocking portion configured to cover a surface of the FPC exposed to the display region.

In example embodiments, the blocking member may further include an auxiliary blocking portion extended from the main blocking portion to cover both side surfaces of the FPC at both sides of the exposed surface.

In example embodiments, the display panel may further have a second drive circuit region. The portable display device may further include a second blocking member. The second blocking member may be arranged on a boundary line between the display region and the second drive circuit region to prevent the attaching member from infiltrating into the second drive circuit region.

In example embodiments, the portable display device may further include a second FPC arranged in the second drive circuit region. The second blocking member may be partially arranged on the boundary line to prevent the attaching member from infiltrating into the second FPC.

In example embodiments, the blocking member may include a transparent material.

In example embodiments, the blocking member may include a double-sided adhesive tape.

In example embodiments, the attaching member may include a resin. The blocking member may include a resin having a viscosity higher than that of the resin used for the attaching member.

According to another aspect of example embodiments, there is provided a portable display device. The portable display device may include a display panel, an FPC, a window, an attaching member and a blocking member. The FPC may be connected to the display panel. The window may be positioned facing to the display panel. The attaching member may be interposed between the display panel and the window to attach the display panel to the window. The blocking member may be configured to cover the FPC to prevent the attaching member from infiltrating into the FPC.

In example embodiments, the blocking member may include a main blocking portion configured to cover a first side surface of the FPC oriented toward a central portion of the display panel.

In example embodiments, the blocking member may further include an auxiliary blocking portion extended from the main blocking portion to cover both side surfaces of the FPC at both sides of the first side surface.

According to still another aspect of example embodiments, there is provided a method of assembling a portable display device. In the method of assembling the portable display device, a blocking member may be formed on a boundary line between a drive circuit region and a display region of a display panel. An attaching member may be coated on the display region of the display panel blocked from the drive circuit region by the blocking member. A window may be attached to the display panel using the attaching member.

In example embodiments, forming the blocking member may include attaching a double-sided adhesive tape to the boundary line.

In example embodiments, forming the blocking member may include coating a resin on the boundary line, and annealing the resin.

In example embodiments, coating the attaching member may include coating a resin.

In example embodiments, the method may further include annealing the attaching member.

In example embodiments, annealing the attaching member may include irradiating an ultraviolet light to the attaching member.

According to yet still another aspect of example embodiments, there is provided a method of assembling a portable display device. In the method of assembling the portable display device, a blocking member may cover a FPC connected to a display panel. An attaching member may be coated on the display panel. A window may be attached to the display panel using the attaching member.

In example embodiments, forming the blocking member may include attaching a double-sided adhesive tape to the FPC.

In example embodiments, the method may further include annealing the attaching member.

In example embodiments, annealing the attaching member may include irradiating an ultraviolet light to the attaching member.

According to example embodiments, the blocking member may be arranged on only the boundary line between the display region and the drive circuit region of the display panel. Thus, flows of the attaching member may be readily controlled using the blocking member having a simple structure to prevent the infiltration of the attaching member into the drive circuit region. As a result, the portable display device may be assembled by a simple process and a low cost.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
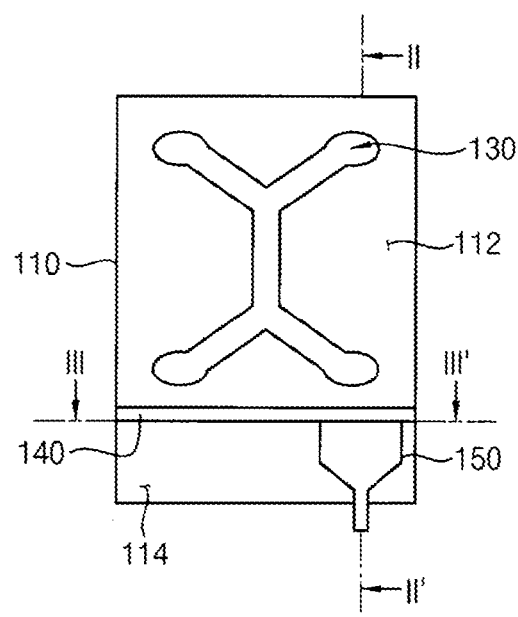
FIG. 1 is a front view illustrating a portable display device in accordance with example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A barrier may be formed at four sides of the display panel to prevent the spill of the resin from the display panel. Particularly, the barriers may include a resin different from the resin used for the attachment member.

However, it may be necessarily required to perform a process for coating the resin, and a process for annealing the resin. Thus, a process for assembling the portable display device may be complicated.

Further, because the resin used for the barrier may be too expensive, a cost for manufacturing the portable display device may be increased.

Figure 2:
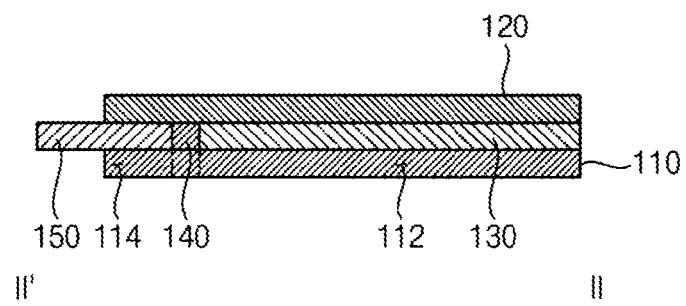
FIG. 2 is a cross-sectional view taken along a line II-II' in FIG. 1.
Figure 3:
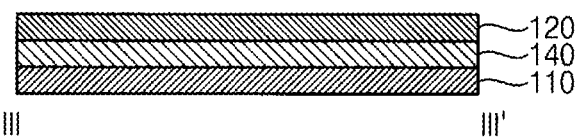
FIG. 3 is a cross-sectional view taken along a line III-III' in FIG. 1.

FIG. 1 is a front view illustrating a portable display device in accordance with example embodiments, FIG. 2 is a cross-sectional view taken along a line II-II' in FIG. 1, and FIG. 3 is a cross-sectional view taken along a line III-III' in FIG. 1.

Referring to FIGS. 1 to 3, a portable display device 100 of this example embodiment may include a display panel 110, a window 120, an attaching member 130 and a blocking member 140.

In example embodiments, the display panel 110 may have a rectangular cross-section. Thus, the display panel 110 may have four side surfaces. Further, the display panel 110 may have a display region 112 and a drive circuit region 114. The display panel 110 may include a liquid crystal display (LCD) panel, a plasma display panel, an organic light emitting display (OLED) panel, etc.

In example embodiments, in FIG. 1, the drive circuit region 114 may correspond to a single region having a rectangular shape that may be positioned adjacent to a lower surface of the display panel 110. The display region 112 may correspond to the rest region of the display panel 110 except for the drive circuit region 114. Shapes, sizes, positions, etc., of the drive circuit region 114 may vary in accordance with kinds of the portable display device 100.

A flexible printed circuit (FPC) 150 may be arranged in the drive circuit region 114. The FPC 150 may apply electrical signals to the display region 112. Thus, the FPC 150 may be exposed to the display region 112.

The window 120 may be arranged over the display panel 110. The window 120 may be attached to the display panel 110 using the attaching member 130. Thus, the attaching member 130 may be interposed between the window 120 and the display panel 110. In example embodiments, the attaching member 130 may be located in only the display region 112. That is, the attaching member 130 may not be arranged in the drive circuit region 114.

In example embodiments, the attaching member 130 may include an insulating resin. The attaching member 130 may be formed by coating a flowable resin between the display panel 110 and the window 120, and by annealing the flowable resin. Thus, the flowable resin before annealing may flow from the display region 112 toward the drive circuit region 114.

The blocking member 140 may be arranged on a boundary line between the display region 112 and the drive circuit region 114. The blocking member 140 may prevent the flowable region in the display region 112 from infiltrating into the drive circuit region 114. Particularly, the blocking member 140 may prevent the insulating resin from being smeared on the flexible printed circuit (FPC) 150 in the drive circuit region 114.

In example embodiments, the blocking member 140 may not surround the four side surfaces of the display panel 110. The blocking member 140 may be arranged on only the boundary line between the display region 112 and the drive circuit region 114. Therefore, the blocking member 140 may have a long stripe shape substantially parallel with a lower side surface of the display panel 110. Further, the blocking member 140 may have a length substantially the same as that of the lower side surface of the display panel 110. Thus, the blocking member 140 may be extended along the whole boundary line between the display region 112 and the drive circuit region 114 to completely isolate the drive circuit region 114 from the display region 112. As a result, because the blocking member 140 may block flows of the attaching member 130 in the display region 112 toward the drive circuit region 114, the attaching member 130 may not infiltrate into the drive circuit region 114.

In example embodiments, in order to prevent a display quality of the portable display device 100 from being deteriorated by the blocking member 140, the blocking member 140 may include a transparent material.

In example embodiments, the blocking member 140 may include a double-sided adhesive tape. The double-sided adhesive tape may be cheap. Further, the double-sided adhesive tape may be easily attached. Therefore, the portable display device 100 may be readily assembled by a simple process and a low cost. Furthermore, the double-sided adhesive tape may have a function as to attach the display panel 110 and the window 120 to each other.

FIGS. 4 to 7 are cross-sectional views illustrating a method of assembling the portable display device in FIG. 1.

Figure 4:
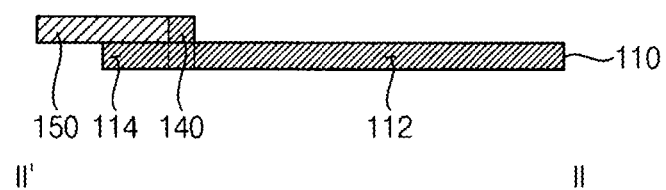
FIGS. 4 to 7 are cross-sectional views illustrating a method of assembling the portable display device in FIG. 1.

Referring to FIG. 4, the blocking member 140 may be formed on the boundary line between the display region 112 and the drive circuit region 114 of the display panel 110. In example embodiments, the blocking member 140 may include a transparent double-sided adhesive tape. Thus, the blocking member 140 may be easily formed by attaching the double-sided adhesive tape on the boundary line between the display region 112 and the drive circuit region 114.

Figure 5:
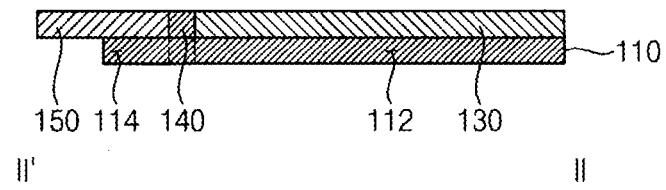

Referring to FIG. 5, the attaching member 130 may be coated on the display region 112 of the display panel 110. In example embodiments, the attaching member 130 may include an insulating resin. Because the insulating resin before annealing may have a flowable property, the resin may flow from the display region 112 into the drive circuit region 114. However, the blocking member 140 on the boundary line between the display region 112 and the drive circuit region 114 may block the resin, so that the resin may not infiltrate into the drive circuit region 114.

Figure 6:
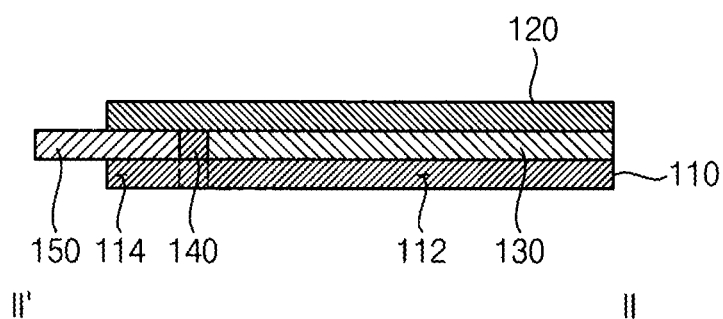

Referring to FIG. 6, the window 120 may be arranged on the attaching member 130. Because the attaching member 130 may not be annealed, the window 120 may not be attached to the display panel 110.

Figure 7:
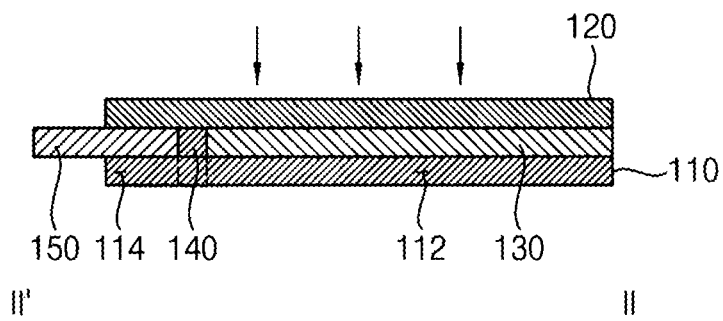

Referring to FIG. 7, the attaching member 130 may be annealed to firmly attach the window 120 and the display panel 130 to each other via the annealed attaching member 130, thereby completing the portable display device 100. In example embodiments, the attaching member 130 may be annealed by irradiating an ultraviolet light to the resin.

Figure 8:
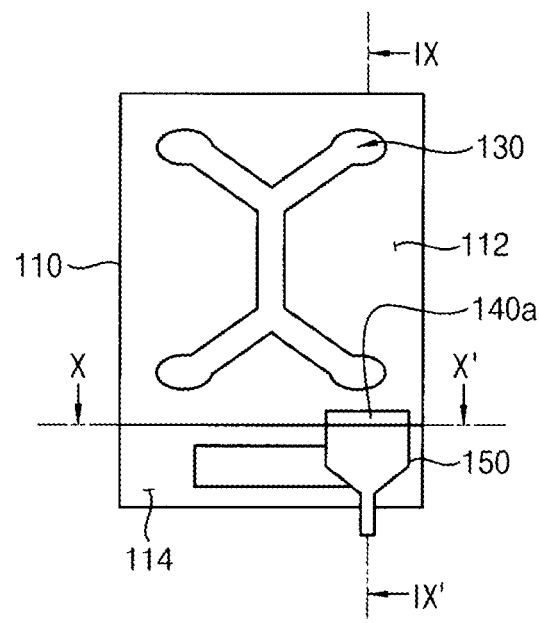
FIG. 8 is a front view illustrating a portable display device in accordance with example embodiments.
Figure 9:
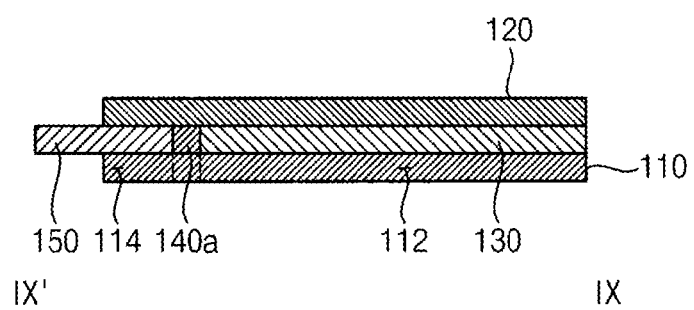
FIG. 9 is a cross-sectional view taken along a line IX-IX' in FIG. 8.
Figure 10:
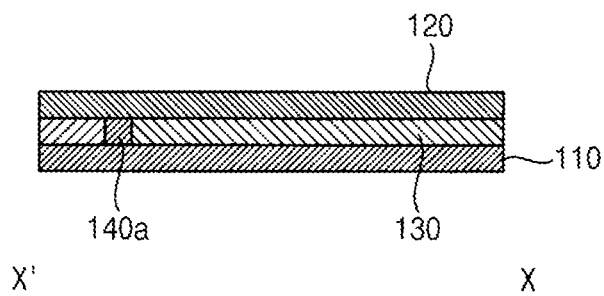
FIG. 10 is a cross-sectional view taken along a line X-X' in FIG. 8.

FIG. 8 is a front view illustrating a portable display device in accordance with example embodiments, FIG. 9 is a cross-sectional view taken along a line IX-IX' in FIG. 8, and FIG. 10 is a cross-sectional view taken along a line X-X' in FIG. 8.

A portable display device 100a of this example embodiment may include elements substantially the same as those of the portable display device 100 in FIG. 1 except for a blocking member 140a. Thus, the same reference numerals may refer to the same elements and any further illustrations with respect to the same element may be omitted herein for brevity.

Referring to FIGS. 8 to 10, the blocking member 140a may block only the FPC 150. In example embodiments, the blocking member 140a may be configured to cover a surface of the FPC 150 exposed to the display region 112 of the display panel 110. The blocking member 140a may make contact with the surface of the FPC 150. Alternatively, the blocking member 140a may be spaced apart from the surface of the FPC 150.

Therefore, the blocking member 140a may be partially formed on the boundary line between the display region 112 and the drive circuit region 114 of the display panel 110. That is, the blocking member 140a may wholly isolate the drive circuit region 114 from the display region 112. The blocking member 140a may block only the surface of the FPC 150 oriented toward the display region 112.

According to this example embodiment, the blocking member 140a may be configured to make contact with only the surface of the FPC 150, so that the blocking member 140a may have a length shorter than that of the blocking member 140 in FIG. 1. Thus, a cost for forming the blocking member 140a may be curtailed compared to the blocking member 140 in FIG. 1.

In example embodiments, a method of assembling the portable display device 100a may include processes substantially the same as those illustrated with reference to FIGS. 4 to 7. Thus, the method of assembling the portable display device 100a may be omitted herein for brevity.

Figure 11:
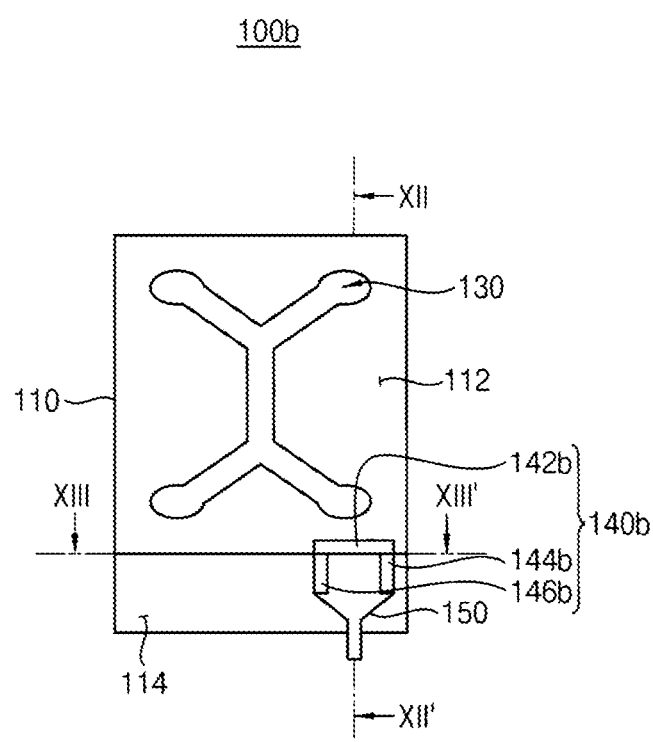
FIG. 11 is a front view illustrating a portable display device in accordance with example embodiments.
Figure 12:
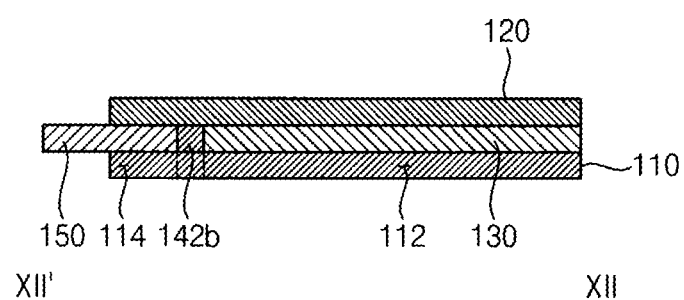
FIG. 12 is a cross-sectional view taken along a line XII-XII' in FIG. 11.
Figure 13:
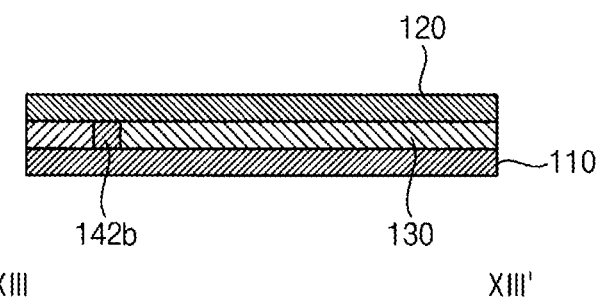
FIG. 13 is a cross-sectional view taken along a line XIII-XIII' in FIG. 11.

FIG. 11 is a front view illustrating a portable display device in accordance with example embodiments, FIG. 12 is a cross-sectional view taken along a line XII-XII' in FIG. 11, and FIG. 13 is a cross-sectional view taken along a line XIII-XIII' in FIG. 11.

A portable display device 100b of this example embodiment may include elements substantially the same as those of the portable display device 100a in FIG. 8 except for a blocking member 140b. Thus, the same reference numerals may refer to the same elements and any further illustrations with respect to the same element may be omitted herein for brevity.

Referring to FIGS. 11 to 13, the blocking member 140b may include a main blocking portion 142b and auxiliary blocking portions 144b and 146b. The main blocking portion 142b may be configured to cover the surface of the FPC 150 exposed to the display region 112 of the display panel 110. The auxiliary blocking portions 144b and 146b may be extended from both ends of the main blocking portion 142b to cover side surfaces of the FPC 150 at both sides of the exposed surface of the FPC 150. In example embodiments, the main blocking portion 142b and the auxiliary blocking portions 144b and 146b may make contact with the FPC 150. Alternatively, the main blocking portion 142b and the auxiliary blocking member 144b and 146b may be spaced apart from the surfaces of the FPC 150. That is, the main blocking portion 142b may have a shape substantially the same as that of the blocking member 140a in FIG. 8. Thus, the blocking member 140b of this example embodiment may have a structure including the blocking member 140a in FIG. 8 by adding the auxiliary blocking portions 144b and 146b.

According to this example embodiment, the auxiliary blocking portions 144b and 146b may cover the side surfaces of the FPC 150 to prevent the attaching member 130 from infiltrating into the side surfaces of the FPC 150.0

In example embodiments, a method of assembling the portable display device 100b may include processes substantially the same as those for assembling the portable display device 100a in FIG. 8 except for a process for forming the blocking member 140b. Thus, the method of assembling the portable display device 100b may be omitted herein for brevity.

Figure 14:
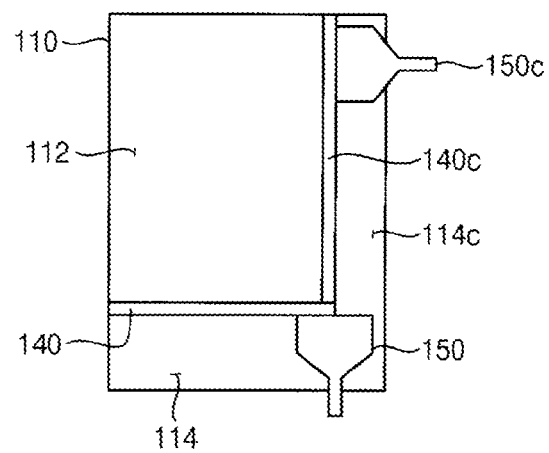
FIG. 14 is a front view illustrating a portable display device in accordance with example embodiments.

FIG. 14 is a front view illustrating a portable display device in accordance with example embodiments.

Referring to FIG. 14, a portable display device 100c of this example embodiment may include a display panel 110, a window 120, an attaching member 130, a first blocking member 140 and a second blocking member 140c.

In example embodiments, the display panel 110 may have a single display region 112, a first drive circuit region 114 and a second drive circuit region 114c. The first drive circuit region 114 may correspond to a region adjacent to a lower side surface of the display panel 110. The second drive circuit region 114c may correspond to a region adjacent to a right side surface of the display panel 110. Thus, the first drive circuit region 114 and the second drive circuit region 114c may form a perpendicularly bent shape.

A first FPC 150 may be arranged in the first drive circuit region 114. A second FPC 150c may be arranged in the second drive circuit region 114c.

The window 120 may be positioned over the display panel 110. The window 120 may be attached to the display panel 110 using the attaching member 130.

The first blocking member 140 may be arranged on a boundary line between the display region 112 and the first drive circuit region 114. The first blocking member 140 may prevent the flowable resin of the attaching member 130 from infiltrating into the first drive circuit region 114 from the display region 112.

The second blocking member 140c may be arranged on a boundary line between the display region 112 and the second drive circuit region 114c. The second blocking member 140c may prevent the flowable resin of the attaching member 130 from infiltrating into the second drive circuit region 114c from the display region 112.

Alternatively, the first blocking member 140 and the second blocking member 140c may have a shape substantially the same as that of the blocking member 140a in FIG. 8 or the blocking member 140b in FIG. 11.

In example embodiments, a method of assembling the portable display device 100c may include processes substantially the same as those illustrated with reference to FIGS. 4 to 7 except for further including a process for forming the second blocking member 140c. Thus, the method of assembling the portable display device 100c may be omitted herein for brevity.

Figure 15:
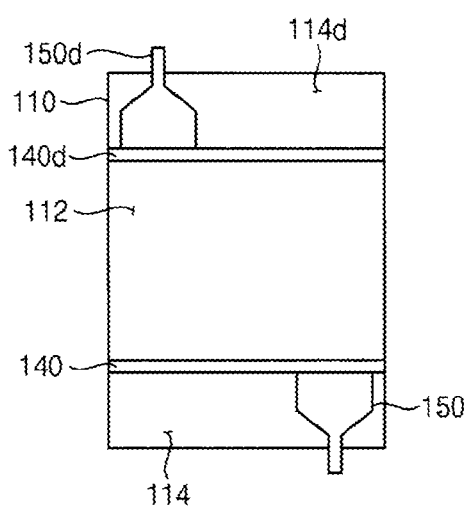
FIG. 15 is a front view illustrating a portable display device in accordance with example embodiments.

FIG. 15 is a front view illustrating a portable display device in accordance with example embodiments.

A portable display device 100d of this example embodiment may include elements substantially the same as those of the portable display device 100c in FIG. 14 except for a position of a second drive circuit region 114d. Thus, the same reference numerals may refer to the same elements and any further illustrations with respect to the same element may be omitted herein for brevity.

Referring to FIG. 15, the second drive circuit region 114d may be positioned adjacent to an upper side surface of the display panel 110. That is, the second drive circuit region 114d may be arranged facing to the first drive circuit region 114.

In example embodiments, a method of assembling the portable display device 100d may include processes substantially the same as those for assembling the portable display device 100c in FIG. 14 except for changing the position of the second blocking member 140d. Thus, the method of assembling the portable display device 100d may be omitted herein for brevity.

Figure 16:
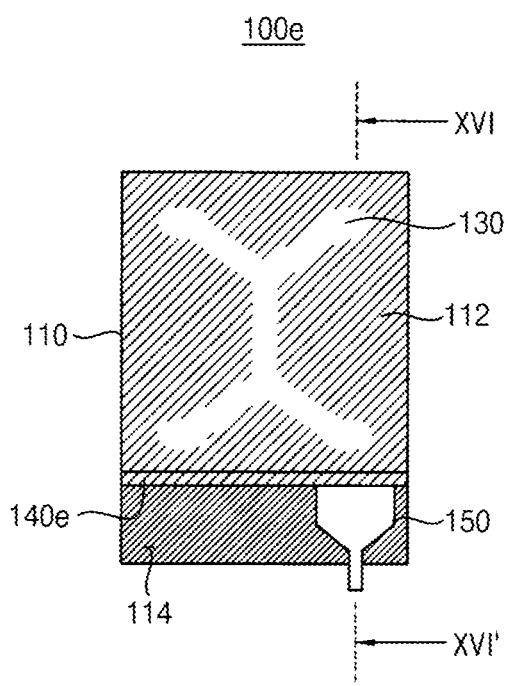
FIG. 16 is a front view illustrating a portable display device in accordance with example embodiments.

FIG. 16 is a front view illustrating a portable display device in accordance with example embodiments.

A portable display device 100e of this example embodiment may include elements substantially the same as those of the portable display device 100 in FIG. 1 except for a material of a blocking member 140e. Thus, the same reference numerals may refer to the same elements and any further illustrations with respect to the same element may be omitted herein for brevity.

Referring to FIG. 16, the blocking member 140e may include a resin. In example embodiments, the resin of the blocking member 140e may not have a high viscosity, so that the resin of the blocking member 140e may have a viscosity higher than that of the resin for the attaching member 130.

In example embodiments, because the blocking member 140e may include the resin, the blocking member 140e may be expensive compared to the double-sided adhesive tapes in above-mentioned example embodiments. However, the blocking member 140e may be arranged along only a single side surface of the display panel 110, not all of the four side surfaces of the display panel 110. Thus, a cost for forming the blocking member 140e may be comparatively lower than that for forming a blocking member arranged along the four side surfaces of the display panel 110.

FIGS. 17 to 21 are cross-sectional views illustrating a method of assembling the portable display device in FIG. 16.

Figure 17:
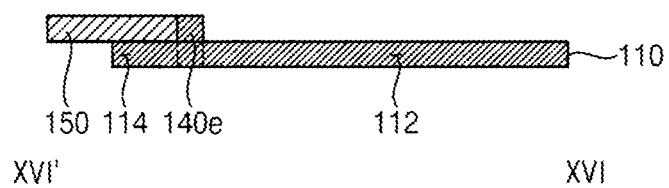
FIGS. 17 to 21 are cross-sectional views illustrating a method of assembling the portable display device in FIG. 16.

Referring to FIG. 17, a resin may be formed on the boundary line between the display region 112 and the drive circuit region 114 of the display panel 110.

Figure 18:
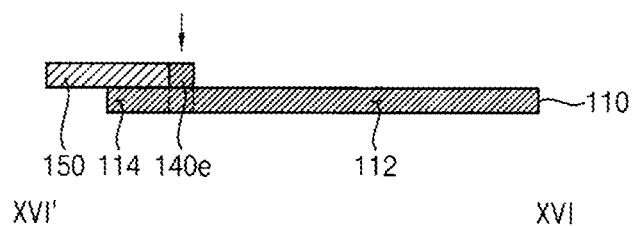

Referring to FIG. 18, an ultraviolet light may be irradiated to the resin to form the blocking member 140e.

Figure 19:
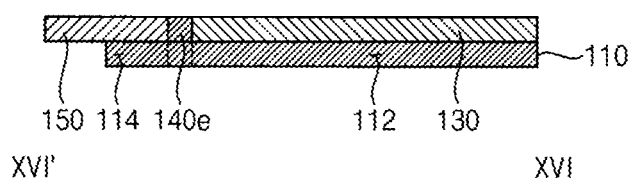

Referring to FIG. 19, the attaching member 130 including a resin may be coated on the display region 112 of the display panel 110. The blocking member 140 on the boundary line between the display region 112 and the drive circuit region 114 may block the resin, so that the resin may not infiltrate into the drive circuit region 114.

Figure 20:
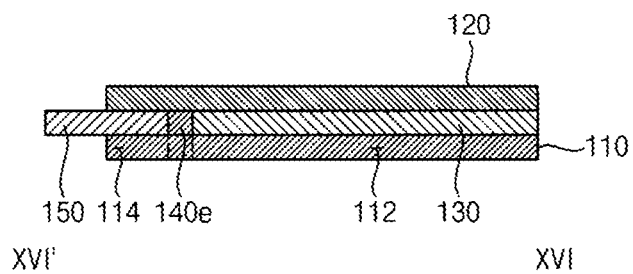

Referring to FIG. 20, the window 120 may be arranged on the attaching member 130.

Figure 21:
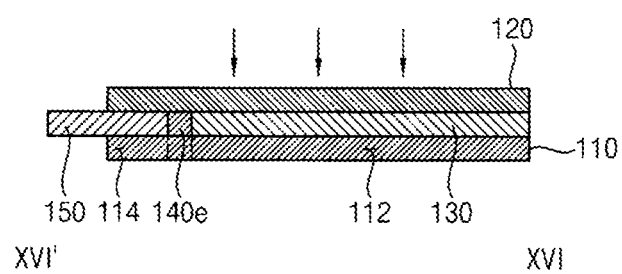

Referring to FIG. 21, an ultraviolet light may be irradiated to the resin until the resin may be annealed to firmly attach the window 120 and the display panel 130 to each other via the annealed attaching member 130, thereby completing the portable display device 100e.

According to some example embodiments, the blocking member may be arranged on only the boundary line between the display region and the drive circuit region of the display panel. Thus, flows of the attaching member may be readily controlled using the blocking member having a simple structure to prevent the infiltration of the attaching member into the drive circuit region. As a result, the portable display device may be assembled by a simple process and a low cost.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A portable display device, comprising:
    a display panel having a drive circuit region and a display region;
    a window arranged facing the display panel;
    an attaching member interposed between the display region of the display panel and the window to attach the window to the display panel; and
    a blocking member arranged between the window and the display panel and only on a boundary separating the drive circuit region located between the window and the display panel and the display region to prevent the attaching member from infiltrating along a space between the window and the display panel into the drive circuit region, the blocking member further comprising an auxiliary blocking portion extended from a main blocking portion to cover side surfaces of the FPC at both sides of the exposed surface of the FPC.

2. The portable display device recited in claim 1, wherein the drive circuit region is arranged adjacent to only one side surface of the display panel, and the blocking member is wholly arranged on the boundary and parallel to the side surface of the display panel.

3. The portable display device recited in claim 1, further comprising:
    a flexible printed circuit (FPC) arranged in the drive circuit region,
    wherein the blocking member is partially arranged on the boundary to preen attaching member from infiltrating, into the FPC.

4. The portable display device recited in claim 1, wherein the display panel further have a second drive circuit region,
    further comprising a second blocking member arranged on a boundary between the display region and the second drive circuit region to prevent the attaching member from infiltrating into the second drive circuit region.

5. The portable display device recited in claim 1, wherein the blocking member comprises a transparent material.

6. The portable display device recited in claim 1, wherein the blocking member comprises a double-sided adhesive tape.

7. The portable display device recited of claim 1, further comprised of the blocking member contacting the FPC.

8. The portable display device recited in claim 3, wherein the blocking member comprises a main blocking portion configured to cover a surface of the FPC exposed to the display region.

9. The portable display device recited in claim 4, further comprising a second FPC arranged in the second drive circuit region,
> wherein the second blocking member is partially arranged on the boundary to prevent the attaching, member from infiltrating into the second FTC.

10. A portable display device, composing:
> a display panel;
> a flexible printed circuit (FPC) connected to the display panel;
> a window arranged facing the display panel;
> an attaching member interposed between the display panel and the window to attach the window to the display panel; and
> a blocking member disposed between the window and the display panel and configured to prevent the attaching member from infiltrating along a space between the window and the display panel into the FPC by separating the flexible printed circuit that is located between the window and the display panel, the blocking member further comprising an auxiliary blocking portion extended from a main blocking portion to cover side surfaces of the FPC at both sides of the surface of the FPC.

11. The portable display device recited in claim 10, further comprised of the blocking member contacting the FPC.

* * * * *